United States Patent [19]
Lerman

[11] Patent Number: 5,566,836
[45] Date of Patent: Oct. 22, 1996

[54] TELECOMMUNICATION RELAY RACK

[75] Inventor: Zev Z. Lerman, Chicago, Ill.

[73] Assignee: Homaco, Inc., Chicago, Ill.

[21] Appl. No.: 456,681

[22] Filed: Jun. 1, 1995

[51] Int. Cl.[6] ........................................ A47F 7/00
[52] U.S. Cl. .............................. 211/26; 211/189; 361/819; 361/825
[58] Field of Search ................ 211/26, 189; 361/819, 361/825, 829, 802, 796, 752, 756

[56] References Cited

U.S. PATENT DOCUMENTS

| | | | |
|---|---|---|---|
| 1,930,275 | 10/1933 | Knowlton et al. | 261/829 X |
| 3,521,129 | 7/1970 | MacKenzie, Jr. | |
| 4,497,411 | 2/1985 | DeBortoli | 211/189 X |
| 4,665,546 | 5/1987 | Brey et al. | |
| 4,715,502 | 12/1987 | Salmon | |
| 5,153,819 | 10/1992 | Hebel | |

Primary Examiner—Ramon O. Ramirez
Assistant Examiner—Michael J. Turgeon
Attorney, Agent, or Firm—Anthony S. Zummer

[57] ABSTRACT

A telecommunication relay rack for mounting on a floor includes a pair of uprights. A horizontal member is secured to the top of the uprights and a base is secured to the bottom of the uprights. The base includes a pair of identical half bases. Each of the half bases is a single unitary member including a squaring plate. A pair of feet is formed integral with opposed ends of each of the squaring feet. Each foot has a toe pad positioned below the bottom of the respective upright. Each upright has a pair of vertically spaced aligning apertures adjacent to the respective bottom on opposite sides of the upright. Each squaring plate has a pair of vertically spaced base apertures aligned with the respective aligning apertures. A base fastener in the base aperture and aligning aperture secures the respective squaring plate to a respective side of each upright to hold the uprights in a substantially vertical attitude parallel to each other. The toe pads are mounted on a floor whereupon the relay rack is supported.

20 Claims, 3 Drawing Sheets

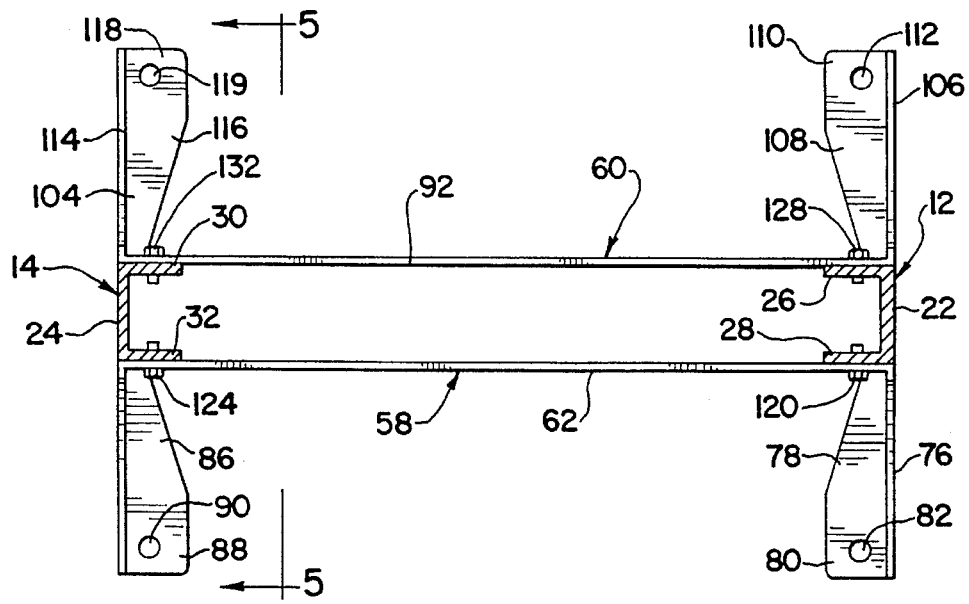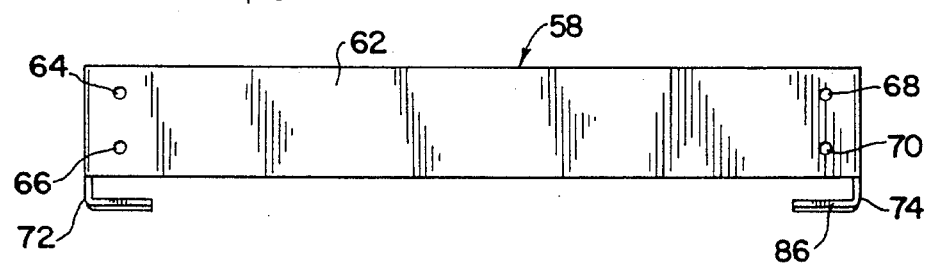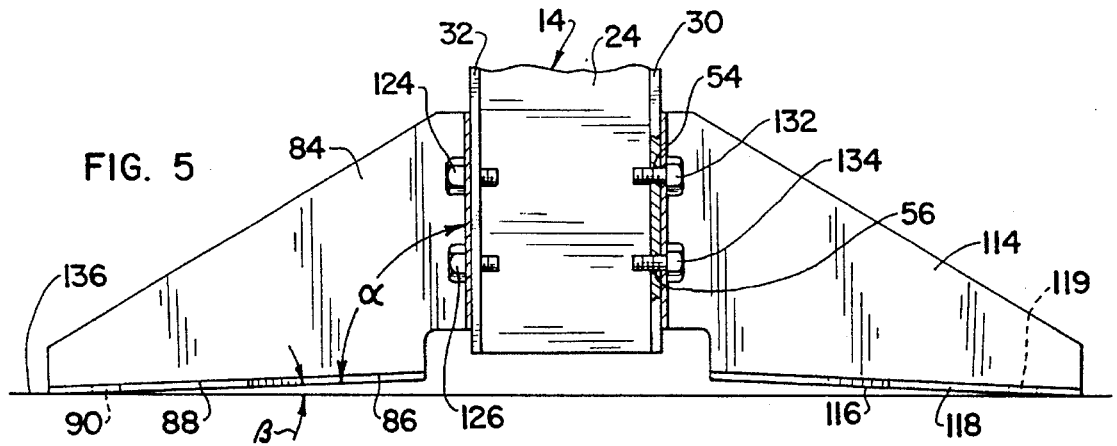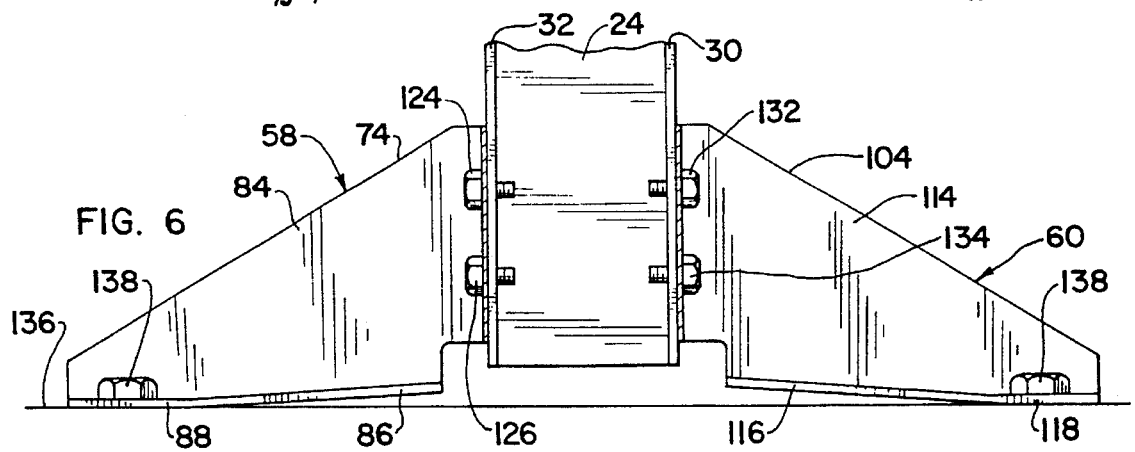

TELECOMMUNICATION RELAY RACK

BACKGROUND OF THE INVENTION

Relay racks are widely used in the telecommunications industry. Typically, a relay rack includes a frame for holding telecommunications operative parts, which parts are interconnected through wires. Each frame has a base which holds the frame upright. Typically, early bases were made of angle iron, such as that shown in U.S. Pat. No. 3,521,129, entitled, "Frame Structure For Wire Termination Blocks", issued Jul. 21, 1970, to Joseph H. MacKenzie, Jr. As weight of the racks become more of a concern, bases were designed to be of lighter weight. A lightweight base is shown in U.S. Pat. No. 4,665,546, entitled, "Modular Distribution Frame Assembly", issued May 12, 1987, to William A. Brey, et al. Another lightweight base is shown in U.S. Pat. No. 4,715,502, entitled, "Telephone Equipment Rack", issued Dec. 29, 1987, to Garland R. Salmon. Another frame construction and base of interest is shown in U.S. Pat. No. 5,153,819, entitled, "Quick Connect Frame", issued Oct. 6, 1992, to Gregory F. Hebel.

It is desirable that a relay rack have a sturdy construction, and it may be installed quickly and easily. A relay rack should be lightweight. A lightweight relay rack reduces the amount of floor loading in a given installation. The lightweight relay rack is also desirable from the standpoint of manufacture in that the lightweight rack is less costly so that the manufacturer may provide the rack to the user at a lower price. Furthermore, the lightweight rack costs less to ship.

Another desirable aspect of a relay rack is to provide a construction wherein the rack may be accommodated to a substantially horizontal floor. The relay rack must be stable. Since the relay rack is shipped in a knocked down condition, the construction of the relay rack must be such that relatively unskilled personnel be capable of assembling and installing the relay rack with an expenditure of a minimum amount of time and effort.

SUMMARY OF THE INVENTION

The present telecommunications relay rack includes a lightweight rack construction for mounting on a substantially horizontal floor. The relay rack has a pair of uprights which uprights are connected to each other at their top by a horizontal member. A base is secured to the bottom of the uprights holding the uprights in a substantially vertical attitude. The base includes identical base halves secured to opposite sides of both of the uprights. Each base half is a single unitary member including a squaring plate. Each upright has a pair of vertically spaced aligning apertures on opposite sides of the upright near the bottom of the upright. Each squaring plate has two pairs of base apertures aligned with the respective aligning apertures. A base fastener is positioned in each base aperture and aligning aperture to secure the respective squaring plate to the uprights. The cooperation of the horizontal member and the squaring plate maintains the spacing of the uprights and holds the uprights parallel in a vertical attitude. Each base half has a pair of resilient elongated feet formed integral with opposed ends of the respective squaring plate. Each foot has a toe pad spaced away from its respective upright and positioned below the bottom of the respective upright. The toe pad is mounted on a horizontal bearing surface to support the relay rack. A stabilizing fastener secures each toe pad to the bearing surface to place each foot under a bending stress.

BRIEF DESCRIPTION OF THE DRAWINGS

FIG. 3 is a cross sectional plan view taken on line 3—3 of FIG. 1;

FIG. 4 is a side elevational view of a base half shown in FIG. 2;

FIG. 5 is a fragmentary cross-sectional end view taken on line 5—5 of FIG. 3 showing a portion of the base of the relay rack attached to an upright and showing the position of a foot of the base relative to a squaring plate with the angle between the foot and the plate exaggerated for purposes of illustration, and showing the angle between the foot and a horizontal bearing surface with the angle therebetween exaggerated for purposes of illustration; and FIG. 6 is similar to FIG. 5, but showing stabilizing fasteners attached to the feet to secure the base to a horizontal bearing surface and the distortion in the feet being exaggerated for purposes of illustration.

DESCRIPTION OF THE PREFERRED EMBODIMENT

Figure 1:
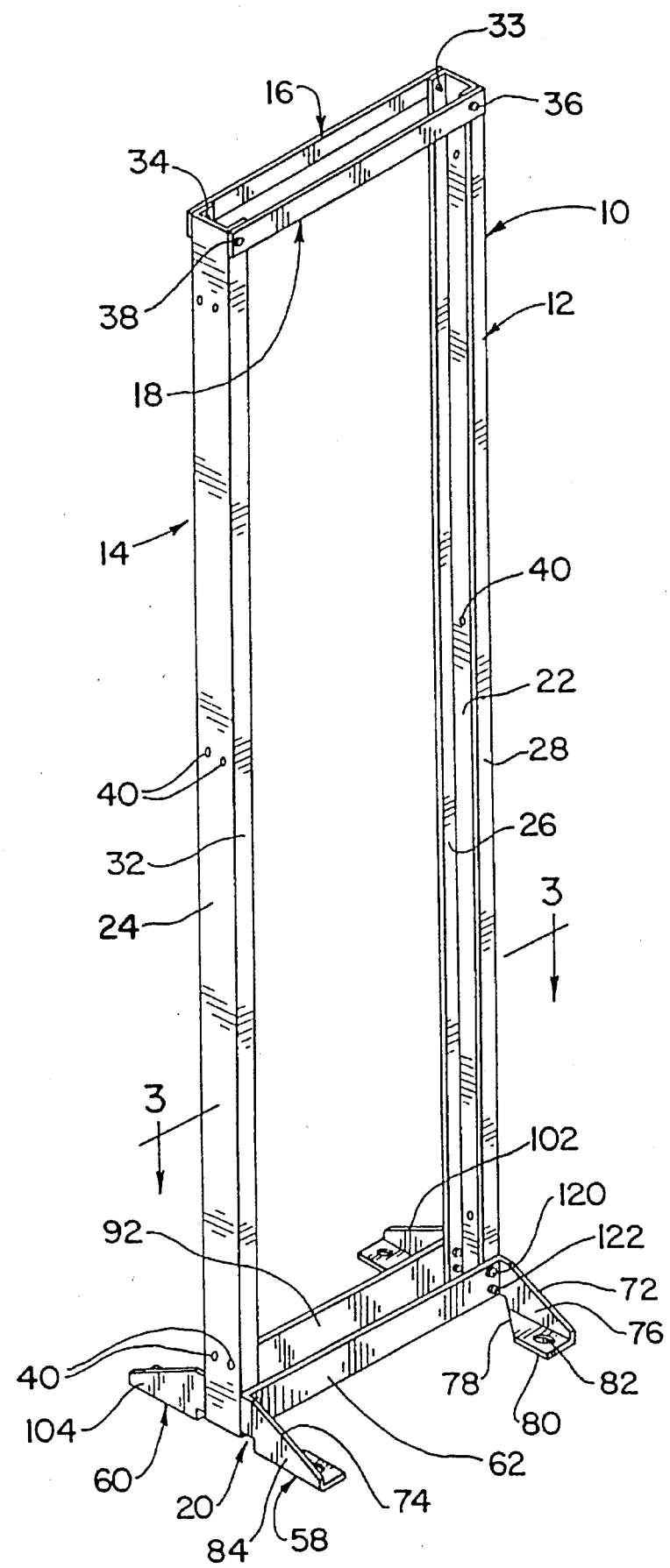
FIG. 1 is a isometric view of a telecommunication relay rack embodying the herein disclosed invention.
Figure 2:
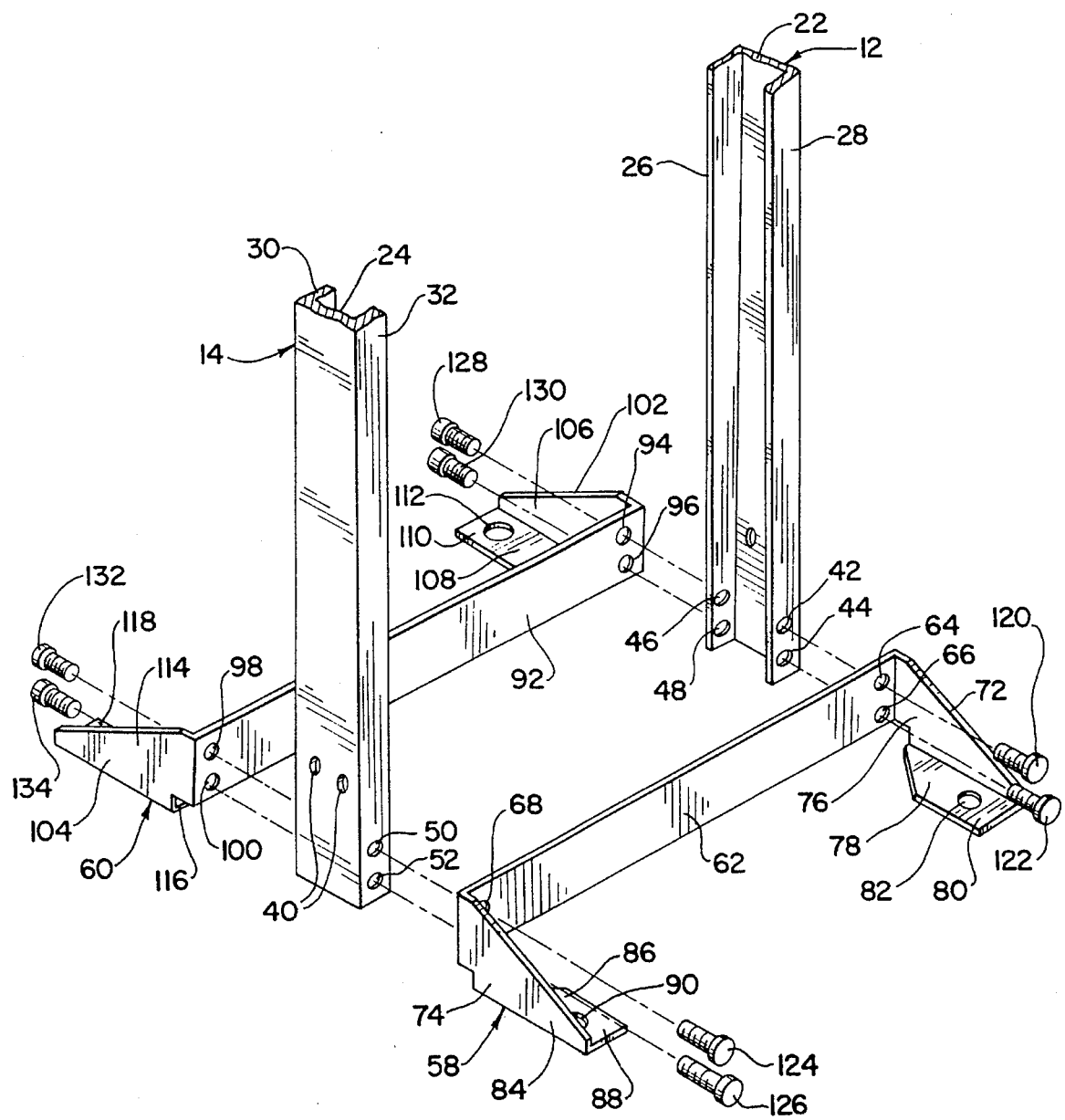
FIG. 2 is an enlarged fragmentary exploded view of the telecommunication relay rack of FIG. 1 showing the interrelationship of parts which make up a base of the relay rack.

Referring now to the drawings, and especially to FIG. 1, a telecommunications relay rack generally indicated by numeral 10 is shown therein. Relay rack 10 generally includes a pair of parallel uprights 12 and 14 connected at their upper ends by a pair of horizontal members, that is, top bars 16 and 18. The lower ends of uprights 12 and 14 are connected to a base 20, which supports the uprights in a vertical attitude.

Uprights 12 and 14 are conventional aluminum lightweight channels which have conventional webs 22 and 24, respectively. Web 22 has a pair of conventional opposed parallel sides 26 and 28 formed integral therewith. Web 24 has conventional opposed parallel sides 30 and 32 formed integral therewith. Top bar 16 is secured to sides 26 and 30 by conventional screws 33 and 34. Top bar 18 is secured to sides 28 and 32 by conventional screws 36 and 38. As is conventional with telecommunication relay racks, webs 22 and 24 have a plurality of mounting holes 40.

Each of the sides of each of the uprights has a pair of aligning apertures or base screw threaded apertures for securing the base to the uprights to square the uprights and hold them in a vertical attitude. Side 28 has a pair of base screw threaded apertures 42 and 44, which are the aligning apertures for that side. In a like manner, side 26 has a pair of base screw threaded apertures 46 and 48. Side 32 has a pair of base screw threaded apertures 50 and 52. Side 30 has a pair of base screw threaded apertures 54 and 56. The spacing of each pair of base screw threaded apertures on each of the sides is identical.

Base 20 includes a pair of identical base halves 58 and 60. Each base half is integral and formed out of a single piece of steel flat stock though any other suitable resilient material may be used. Base half 58 includes a rectangular flat squaring plate 62. The squaring plate has a pair of base apertures or screw openings 64 and 66 adjacent to one end. Screw openings 64 and 66 are registerable with the base screw threaded apertures 42 and 44. A pair of base apertures or screw openings 68 and 70 is formed adjacent to the other end of the squaring plate. Screw openings 68 and 70 are registerable with base screw apertures 50 and 52. An elongated foot 72 is formed integral with one end of squaring plate 62, and an elongated foot 74 is formed integral with the other end of the squaring plate. Feet 72 and 74 extend away from the uprights and are resilient to stabilize the rack on a floor-like bearing surface. Foot 72 has a sidewall 76 formed integral with the end of the squaring plate. A flat foot sole 78 is formed integral with sidewall 76. Sole 78 has a toe pad 80 as part of the sole. A mounting aperture 82 is formed in the toe pad. In a like manner, foot 74 has a sidewall 84 formed integral with the other end of the squaring plate, and a foot sole 86 is formed integral with sidewall 84. Foot sole 86 includes a toe pad 88 with a mounting aperture 90 formed in the toe pad 88. Foot sole 86 and foot sole 78 are in the same plane.

Foot soles 78 and 86 of feet 72 and 74, respectively, define an angle α between the plane of the bottom of the foot soles and squaring plate 62 as shown in FIG. 5. It has been found that an angle of 91° is an effective angle. However, the range for angle α may be from 90½° to 95°. The angle α must be greater than 90°, so that the toe pads 80 and 88 are below the bottom of their respective uprights.

Base half 60 has an identical construction to base half 58. Base half 60 includes a flat rectangular squaring plate 92 having on one end a pair of base apertures or screw openings 94 and 96, which are registerable with base screw threaded apertures 46 and 48. The other end of squaring plate 92 has a pair of base apertures or screw openings 98 and 100, which are registerable with the base screw threaded apertures 54 and 56, respectively, in side 30. Base 60 has a foot 102 formed integral with one end of squaring plate 92 and a foot 104 formed integral with the other end of the squaring plate. Feet 102 and 104 extend away from the uprights and are resilient to stabilize the rack on a floor-like bearing surface. Foot 102 includes a sidewall 106 formed integral with one end of squaring plate 92 and a foot sole 108 formed integral with sidewall 106. Foot sole 108 has a toe pad 110 as part of the foot sole. A mounting aperture 112 is formed in toe pad 110. Foot 104 has a sidewall 114 formed integral with the other end of squaring plate 92. A foot sole 116 is formed integral with the sidewall 114. Foot sole 116 has a toe pad 118 as part of the foot sole. The toe pad 118 has a mounting aperture 119 contained therein.

Foot soles 108 and 116 are in the same plane and have the same angle α between foot soles 108 and 116 and squaring plate 92 as do the foot soles and the squaring plate of base half 58. As with base half 58, angle α must be greater than 90°, so that toe pads 110 and 118 are below their respective uprights.

The present telecommunications relay rack 10 may be readily shipped from the manufacturer to the customer in a knocked-down condition, thereby saving space and reducing shipping charges. The customer may easily assemble the rack by attaching top bars 16 and 18 to the upper end of the uprights 12 and 14 by screws 33, 34, 36 and 38. The base is attached to the lower end of the uprights. Base half 58 is secured to the uprights by inserting base fastener, that is, conventional base screws 120 and 122 into screw openings 64 and 66, then threading the screws into base screw threaded aperture 42 and 44, respectively. Another pair of base fasteners or conventional base screws 124 and 126 is inserted into screw openings 68 and 70, respectively, and then threaded into base screw threaded apertures 50 and 52, respectively. Base half 60 is also secured to the uprights in a like manner. A pair of base fasteners or conventional base screws 128 and 130 is positioned in screw apertures 94 and 96, respectively, and then threaded into base screw threaded apertures 46 and 48, respectively. In a like manner, a pair of base fasteners or conventional base screws 132 and 134 is positioned in screw openings 98 and 100, respectively, and threaded into the base screw threaded apertures 54 and 56, respectively.

Once the base screws are in place and tightened securely, the uprights are aligned in a parallel relationship, and are aligned perpendicular to the squaring plates 62 and 92. The upper end of each of the uprights is secured to the top bars. The bottom ends of the uprights are secured to the two squaring plates by a pair of spaced screws on each of the sides. There are three screws on each side connected to each upright, thereby aligning the uprights perpendicular to the squaring plates. Since the squaring plates are fixed to the uprights, the angle between the plane of the feet and the uprights is the same as angle α.

Once the top bars and the base are secured to the uprights, the rack is set up on a horizontal support bearing surface or floor 136. It is important to note that the squaring plates hold the uprights vertical, so that the foot soles have their respective toe pads below the ends of the uprights. The plane of foot soles forms an angle β with floor 136. The angle β is preferably 1°. However, the range may be from ½° to 5°.

Relay rack 10 is fixed in its upright position by stabilizing fasteners. A stabilizing fastener screw 138 is mounted in each of the mounting apertures on each of the feet. Each stabilizing fastener screw 138 is tightened down so that the toe pad of each foot under the head of each screw conforms to the surface of floor 136, thereby placing each foot under a bending stress. This arrangement creates an approximation to a classic three-member three-hinge arch form, which keeps the uprights in a vertical attitude relative to floor 136. By placing the feet under stressed condition, the stability of the rack is enhanced. In practice, the rack has a typical height of seven feet (2.13 meters), sometimes going up to ten feet (3.048 meters). The length of the feet of the base is typically less than eight inches (20.32 centimeters), so that the ratio of height to base width is 5.25 to 1 or greater. The present unitary construction of the base halves provides a lightweight construction which provides a high degree of stability for the rack.

Although a specific embodiment of the herein disclosed invention has been shown and described in detail above, it is readily apparent that those skilled in the art may make various modifications and changes without departing from the spirit and scope of the present invention. It is to be expressly understood that the scope of this invention is limited only by the appended claims.

What is claimed is:

1. A telecommunication relay rack for mounting on a substantially horizontal floorlike surface, said relay rack having a pair of substantially parallel vertical uprights, each of said uprights having a top at its upper end and a bottom at its lower end, a horizontal member secured to each of the uprights adjacent to the top of each of the uprights, and a base secured to the uprights adjacent to the bottom of each of the uprights holding the uprights in a substantially vertical attitude, said base including a pair of identical base halves secured to opposite sides of the uprights, each of said base halves being a single unitary member including a squaring plate fixed to one side of the uprights, each base half having a pair of feet integral with the respective squaring plate, each pair of feet extending away from the uprights, and each foot having a toe pad spaced away from its respective upright, each foot having its toe pad positioned below the bottom of the respective upright.

2. A telecommunication relay rack for mounting on a substantially horizontal floorlike surface, as defined in claim 1, wherein each foot forms an angle greater than 90° with its respective squaring plate.

3. A telecommunication relay rack for mounting on a substantially horizontal floorlike surface, as defined in claim 1, wherein each of said feet is an elongated resilient foot.

4. A telecommunication relay rack for mounting on a substantially horizontal floorlike surface, as defined in claim 1, wherein each of said feet is an elongated resilient foot forming an angle greater than 90½° with its respective squaring plate.

5. A telecommunication relay rack for mounting on a substantially horizontal floorlike surface, as defined in claim 1, wherein each of a pair of opposite sides of each of said uprights has a pair of vertically spaced aligning apertures adjacent to the respective bottom of the respective upright, each of said squaring plates having a pair of vertically spaced base apertures adjacent to each of a pair of horizontally spaced opposed ends of the respective squaring plate, said pair of base apertures on opposed ends of each of said squaring plates being registerable with respective aligning apertures on a respective side of a respective upright, and a base fastener positioned in each base aperture and respective aligning aperture securing the respective squaring plate to a respective side of a respective upright, said base fasteners with the squaring plates and uprights cooperating with the horizontal member to hold the uprights in a substantially vertical attitude and parallel to each other.

6. A telecommunication relay rack for mounting on a substantially horizontal floorlike surface, said relay rack having a pair of substantially parallel vertical uprights, each of said uprights having a top at its upper end and a bottom at its lower end, a horizontal member secured to each of the uprights adjacent to the top of the uprights, and a base secured to the uprights adjacent to the bottom of each of the uprights holding the uprights in a substantially vertical attitude, said base including a pair of identical base halves secured to opposite sides of the uprights, each of said base halves including a horizontal squaring plate, each of said uprights having a pair of vertically spaced aligning apertures adjacent to the respective bottom on opposed sides of the upright, each of said squaring plates having a pair of vertically spaced base apertures adjacent to each of a pair of horizontally spaced opposed ends of the respective squaring plate, said base apertures on an opposed end of each of said squaring plates being in registry with respective aligning apertures on a respective side of a respective upright, a base fastener positioned in each base aperture and respective aligning aperture securing the respective base half to a respective side of a respective upright, said base fasteners with the squaring plates and uprights cooperating with the horizontal member to hold the uprights in a substantially vertical attitude and parallel to each other, and each base half having a foot fixed to the respective squaring plate, each foot extending away from the respective uprights.

7. A telecommunication relay rack for mounting on a substantially horizontal floorlike surface, as defined in claim 6, wherein each foot forms an angle greater than 90½° with its respective squaring plate.

8. A telecommunication relay rack for mounting on a substantially horizontal floorlike surface, as defined in claim 6, wherein each foot is an elongated resilient foot.

9. A telecommunication relay rack for mounting on a substantially horizontal floorlike surface, as defined in claim 6, wherein each foot is an elongated resilient foot forming an angle greater than 90½° with its respective squaring plate.

10. A telecommunication relay rack installation including;
a relay rack having a pair of substantially parallel uprights resiliently held in a substantially vertical attitude, each of said uprights having a top at its upper end and a bottomat its lower end, a horizontal member secured to each of the uprights adjacent to the top of the uprights, and a base secured to the uprights adjacent to the bottom of each of the uprights resiliently holding the uprights in a substantially vertical attitude, said base including a pair of identical base halves secured to opposite sides of the uprights, each of said base halves being a single unitary member including a squaring plate fixed to one side of the uprights, each base half having a pair of elongated resilient feet integral with the respective squaring plate, each pair of feet extending away from the uprights, and each foot having a toe pad spaced away from its respective upright, each foot having its toe pad positioned below the bottom of the respective upright, and a substantially horizontal bearing surface connected to the toe pads to support the relay rack.

11. A telecommunication relay rack installation as defined in claim 10, wherein each of said toe pads has a fastener aperture, and a stabilizing fastener mounted in each fastener aperture and connected to the horizontal bearing surface fixing each toe pad to the horizontal bearing surface.

12. A telecommunication relay rack installation as defined in claim 10, including a line defined by each toe pad and the bottom of the respective vertical upright, each said line and the respective squaring plate defining an angle greater than 90½° and less than 95°.

13. A telecommunication relay rack installation as defined in claim 10, wherein each foot in an unstressed condition defines an angle between the foot and the horizontal bearing surface greater than ½°, and a stabilizing fastener connected to each toe pad and connected to the horizontal bearing surface to force each toe pad to conform to a portion of the horizontal bearing surface and create in each foot a bending stress.

14. A telecommunication relay rack installation as defined in claim 10, wherein each of said uprights has a pair of vertically spaced aligning apertures adjacent to the respective bottom on each of a pair of opposite sides of the respective upright, each of said squaring plates having a pair of vertically spaced base apertures adjacent to each of a pair of horizontally spaced opposed ends of the respective bar, said base apertures on an opposed end of each of said squaring plates being registerable with respective aligning apertures on a respective side of a respective upright, and a base fastener positioned in each base aperture and respective aligning aperture securing the respective squaring plate to a respective side of a respective upright, said base fasteners with the squaring plates and uprights cooperating with the horizontal member to hold the uprights in a substantially vertical attitude and parallel to each other, a line defined by each toe pad and the bottom of the respective vertical upright, and each line and the horizontal bearing surface defining an angle greater than ½° prior to securing each foot to the horizontal bearing surface.

15. A telecommunication relay rack installation as defined in claim 10, wherein each of said uprights has a pair of vertically spaced aligning apertures adjacent to the respective bottom on each of a pair of opposite sides of the respective upright, each of said squaring plates having a pair of vertically spaced base apertures adjacent to each of a pair of horizontally spaced opposed ends of the respective squaring plate, said base apertures on an opposed end of each of said squaring plates being registerable with respective aligning apertures on a respective side of a respective upright, and a base fastener positioned in each base aperture and respective aligning aperture securing the respective squaring plate to a side of a respective upright, said base fasteners with the squaring plates and uprights cooperating with the horizontal member to hold the uprights in a substantially vertical attitude and parallel to each other, each foot in an unstressed condition defining an angle between the foot and the horizontal bearing surface greater than ½, and a stabilizing fastener connected to each toe pad and connected to the horizontal bearing surface forcing a portion of each toe pad to conform to a portion of the horizontal bearing surface and to create a bending stress in each foot.

16. A telecommunication relay rack installation including; a relay rack having a pair of substantially parallel uprights held in a substantially vertical attitude, each of said uprights having a top at its upper end and a bottom at its lower end, a horizontal member secured to each of the uprights adjacent to the top of the respective upright, and a base secured to the uprights adjacent to the bottom of each of the uprights holding the uprights in a substantially vertical attitude, said base including a pair of identical base halves secured to opposite sides of the uprights, each of said base halves including a horizontal squaring plate, each of said uprights having a pair of vertically spaced aligning apertures adjacent to the bottom on opposed sides of the respective upright, each of said squaring plates having a pair of vertically spaced base apertures adjacent to each of a pair of horizontally spaced opposed ends of the respective squaring plate, said base apertures on an opposed end of each of said squaring plates being registerable with respective aligning apertures on a respective side of a respective upright, a base fastener positioned in each base aperture and respective aligning aperture securing the respective base half to a respective side of a respective upright, said base fasteners with the squaring plates and uprights cooperating with the horizontal member to hold the uprights in a substantially vertical attitude and parallel to each other, each base half having a foot fixed to the respective squaring plate, each foot extending away from the respective uprights, each foot including a toe pad extending below the bottom of the respective upright, and a substantially horizontal bearing surface connected to the toe pads supporting the relay rack.

17. A telecommunication relay rack installation as defined in claim 16, wherein each of said toe pads has a mounting aperture, and a stabilizing fastener mounted in each mounting aperture and connected to the horizontal bearing surface fixing each toe pad to the horizontal bearing surface.

18. A telecommunication relay rack installation as defined in claim 16, including a line defined by each toe pad and the bottom of the respective vertical upright, each line defining an angle greater than 90½° with its respective squaring plate.

19. A telecommunication relay rack installation as defined in claim 16, wherein each foot in an unstressed condition defines an angle between the foot and the respective upright greater than 90½°, and a stabilizing fastener connected to each toe pad and to the horizontal bearing surface to force a portion of each toe pad to conform to a portion of the horizontal bearing surface and to create a bending stress in each foot.

20. A telecommunication relay rack installation as defined in claim 16, each foot being formed integral with one end of each of the respective squaring plate, each foot in an unstressed condition defining an angle between the foot and the bearing surface greater than ½ and less than 5°, and a stabilizing fastener connected to each toe pad and connected to the horizontal bearing surface to force a portion of each toe pad to conform to a portion of the horizontal bearing surface and to create a bending stress in each foot.

* * * * *

UNITED STATES PATENT AND TRADEMARK OFFICE
CERTIFICATE OF CORRECTION

PATENT NO. : 5,566,836
DATED : October 22, 1996
INVENTOR(S) : Zev Z. Lerman

It is certified that error appears in the above-indentified patent and that said Letters Patent is hereby corrected as shown below:

Column 7, Line 7, delete "$\frac{1}{2}$" and substitute therefor --$\frac{1}{2}°$--

Column 8, Line 29, delete "$\frac{1}{2}$" and substitute therefor --$\frac{1}{2}°$--

Signed and Sealed this

Eleventh Day of February, 1997

Attest:

BRUCE LEHMAN

*Attesting Officer*  *Commissioner of Patents and Trademarks*